US007085874B2

(12) United States Patent
Penton et al.

(10) Patent No.: US 7,085,874 B2
(45) Date of Patent: Aug. 1, 2006

(54) SYNCHRONOUS/ASYNCHRONOUS BRIDGE CIRCUIT FOR IMPROVED TRANSFER OF DATA BETWEEN TWO CIRCUITS

(75) Inventors: Antony John Penton, Cambridge (GB); Richard Roy Grisenthwaite, Nr Royston (GB)

(73) Assignee: ARM Limited, Cambridge (GB)

( * ) Notice: Subject to any disclaimer, the term of this patent is extended or adjusted under 35 U.S.C. 154(b) by 245 days.

(21) Appl. No.: 10/815,980

(22) Filed: Apr. 2, 2004

(65) Prior Publication Data

US 2005/0228929 A1 Oct. 13, 2005

(51) Int. Cl.

| | |
|---|---|
| ***G06F 5/06*** | (2006.01) |
| ***G06F 13/36*** | (2006.01) |
| ***G06F 1/06*** | (2006.01) |
| *G06F 1/26* | (2006.01) |
| *G11C 7/00* | (2006.01) |

(52) U.S. Cl. ........................ 710/306; 710/310; 710/52; 713/501; 713/600; 370/401

(58) Field of Classification Search ................ 710/306, 710/310, 311, 52, 53, 100, 33, 307; 713/322, 713/501, 600; 712/29; 709/253; 375/354; 370/230, 232, 235, 401, 402; 340/2.1

See application file for complete search history.

(56) References Cited

U.S. PATENT DOCUMENTS

| | | | | |
|---|---|---|---|---|
| 3,051,787 | A * | 8/1962 | Parks | 178/70 R |
| 5,450,549 | A * | 9/1995 | Casparian | 345/556 |
| 6,289,065 | B1 * | 9/2001 | Holt et al. | 375/372 |
| 2005/0055489 | A1 * | 3/2005 | Elliott | 710/310 |
| 2005/0086019 | A1 * | 4/2005 | Yeh et al. | 702/117 |
| 2005/0228929 | A1 * | 10/2005 | Penton et al. | 710/306 |
| 2006/0015678 | A1 * | 1/2006 | Wang et al. | 711/104 |

OTHER PUBLICATIONS

"Isochronous Ethernet-an ATM bridge for multimedia networking" by Worsley et al. (abstract only) Publication Date: Jan. Mar. 1997.*

* cited by examiner

*Primary Examiner*—Gopal C. Ray
(74) *Attorney, Agent, or Firm*—Nixon & Vanderhye P.C.

(57) ABSTRACT

The bridge circuit comprises a first interface circuit operable to receive data from a data source at a first data rate; a second interface circuit operable to transmit the data to a data receiver at a second data rate; a data coupling circuit comprising: a synchronous coupling circuit operable to pass said data synchronously between the first interface circuit and the second interface circuit; and an asynchronous coupling circuit operable to pass the data asynchronously between the first interface circuit and the second interface circuit. Control logic is responsive to a synchronous transfer request signal to cause data to be passed by the synchronous coupling circuit once any data within the asynchronous coupling circuit has been emptied.

20 Claims, 3 Drawing Sheets

SYNCHRONOUS/ASYNCHRONOUS BRIDGE CIRCUIT FOR IMPROVED TRANSFER OF DATA BETWEEN TWO CIRCUITS

BACKGROUND OF THE INVENTION

1. Field of the Invention

The present invention relates to a bridge circuit.

2. Description of the Prior Art

It is known to transfer data between circuits using any number of different techniques. Two such known techniques are synchronous and asynchronous data transfer.

Where two circuits between which data being transferred operate at the same frequency, or the frequency of one circuit is an integer multiple of the other, then data can typically be transferred synchronously. During synchronous data transfer, a common clock signal provides timing information which is used to co-ordinate the data transfer between the circuits. The common clock signal is supplied to the circuits and the data transfer typically occurs with reference to a point during each clock cycle. For example, where the two circuits are coupled by a bus, then on the rising edge of the clock signal the transmitting circuit may drive a data value onto the bus and on the rising edge of the next clock signal the receiving circuit will capture that data value.

Where two circuits between which data being transferred operate at different frequencies (in which the frequency of one circuit is not an integer multiple of the other), then data is typically transferred asynchronously. To facilitate asynchronous data transfer a bridge circuit may be provided.

Bridge circuits are known and may be used as an interface between two circuits which typically process data at different data rates. The bridge circuit can receive data from a source circuit at a particular data rate and can then transmit that data onto a receiver circuit at another data rate, thereby facilitating the transfer of data between the two circuits.

One such known bridge circuit is illustrated with reference to FIG. 1A, the operation of that circuit is shown in FIG. 1B.

The bridge circuit 20 is provided between a processor core 10 and a memory 30. The bridge circuit 20 receives a clock signal $CLK_1$ which is indicative of the data rate of data provided by the core 10 over the bus 15. The bridge circuit 20 also receives a clock signal $CLK_2$ which is indicative of the data rate of data that can be received by the memory 30. The bridge circuit 20 has three registers 22, 24, 26 arranged in series between the data bus 15 and the data bus 45. The first register 22 is clocked by the clock signal $CLK_1$, whereas the registers 24 and 26 receive the clock signal $CLK_2$. These three registers 22, 24 26 facilitate the transfer of data between the data bus 15 and the data bus 45.

The operation of the bridge circuit 20 will now be described with reference to FIG. 1B.

Firstly, the operation of the register 22 will be described. At time $t_0$ the data value A provided by the core 10 on the data bus 15 is clocked on the rising edge of the clock signal $CLK_1$ into the register 22 and is then available on the data bus 25. Between times $t_0$ and $t_1$ the data value provided by the core 10 changes from data value A to data value B. At time $t_1$ the data value B is latched into the register 22 and is then available on the data bus 25.

Next, the operation of the registers 24 and 26 will be described. At clock cycle 0 the data value provided on the bus 25 is latched into the register 24. Hence, data value A is latched into the register 24.

At clock cycle 1 the data value A is then latched into the register 26 and is subsequently available to the memory over the data bus 45. Also at clock cycle 1 the data value provided on the data bus 25 is latched into the register 24. However, because the data value provided on the data bus 25 transitions from data value A to data value B just before clock cycle 1, the data value provided to the register 26 is in an indeterminate state X for a period of time. However, prior to clock cycle 2 occurring the data value settles to data value B and at clock cycle 2 data value B is latched into the register 26. Hence, it will be appreciated that data values provided on by the core 10 can be available to the memory 30 with a latency of around only 3 clock cycles (e.g. data value A is available from the core 10 prior to clock cycle 0 and will be available to the memory 30 on the rising edge of clock cycle 2).

Accordingly, it can be seen that data values can be provided to the bridge circuit 20 at one data rate and then provided to the memory 30 at a different data rate, thereby enabling asynchronous data transmission to occur. Equally, data values can be provided to the bridge circuit 20 and then provided to the memory 30 at the same data rate. However, in either situation, the provision of the three registers in the bridge circuit 20 introduces a short latency to the data transfer. Although this latency is undesirable because it slows the data transfer, the provision of the three registers enables data to be reliably transferred between the core 10 and the memory 30 since the clocking arrangement ensures that any indeterminate states have settled prior to the data values being provided by the bridge circuit to the devices between which it is coupled It is an object of the present invention to provide an improved bridge circuit.

SUMMARY OF THE INVENTION

According to a first aspect of the present invention there is provided a bridge circuit comprising: a first interface circuit operable to receive data from a data source at a first data rate; a second interface circuit operable to transmit the data to a data receiver at a second data rate; a data coupling circuit comprising: a synchronous coupling circuit operable to pass the data synchronously between the first interface circuit and the second interface circuit; and an asynchronous coupling circuit operable to pass the data asynchronously between the first interface circuit and the second interface circuit, the bridge circuit further comprising control logic responsive to a synchronous transfer request signal indicating that either the first data rate is an integer multiple of the second data rate or the second data rate is an integer multiple of the first data rate to cause data to be passed by the synchronous coupling circuit once any data within the asynchronous coupling circuit has been emptied.

The present invention recognises that it is becoming increasingly common for the data rate of devices between which a bridge circuit is coupled to be arranged to vary dynamically. These variations in data rate are made primarily for energy consumption reasons. Hence, there will be situations when the data rate of data received from the data source differs from that of the data receiver. Equally, there will be situations when the data rate of data received from the data source will be an integer multiple of the data rate of the data receiver. When the data rate of data received differs from the data rate of data to be transmitted then it is desirable to operate the bridge in a manner which enables the data to be passed in asynchronously between the two devices.

However, the present invention also recognises that whilst it is possible to operate the bridge asynchronously when the two data rates are equal, operating the bridge in this way introduces latency which in turn reduces the efficiency of any data transfers between the two devices.

However, the present invention overcomes this latency problem by enabling the bridge circuit to dynamically switch to support synchronous data transfer when the two data rates are integer multiples. By enabling the bridge circuit to operate synchronously the latency caused by the bridge circuit can be reduced. It will be appreciated that reducing any latency caused by the bridge circuit significantly improves the efficiency of data transfers between the data source and the data receiver. It will also be appreciated that in during any significant data transfer between the data source and the data receiver, it would be preferable to operate both of these devices at the same data rate. Hence, enabling the data to be transferred in a synchronous manner significantly improves the efficiency of that data transfer at the time when very efficient data transfer is desirable.

Providing two coupling circuits enables the bridge circuit to support both synchronous and asynchronous data transfers. Control logic receives a synchronous transfer request signal which indicates that synchronous data transfer can occur using the synchronous coupling circuit because either the first data rate is an integer multiple of the second data rate or the second data rate is an integer multiple of the first data rate.

However, the present invention also recognises that simply switching to using the synchronous coupling circuit to transfer data immediately on receipt of the synchronous transfer request signal may result in data with that circuit being lost or corrupted because the asynchronous coupling circuit will suffer from some degree of latency. Accordingly, the control logic prevents data from being passed through the synchronous coupling circuit until all the data in the asynchronous coupling circuit has been transmitted to ensure that no data is lost when a switch is requested.

Hence, it will be appreciated that there is provided a bridge circuit which can dynamically switch between synchronous and asynchronous data transfer. When the operating frequencies of the data source and data receiver are suitable to support synchronous data transfer, the bridge circuit can simply be signalled to switch to transferring data synchronously. On receipt of the signal, the bridge circuit will automatically, and without any further external control, switch to transferring data synchronously at the appropriate time, without corrupting or losing any data. It will be appreciated that such an arrangement provides for an extremely reliable and flexible bridge circuit.

In one embodiment, the control logic is further operable in response to the synchronous transfer request signal to prevent the data source from supplying data to the first interface circuit until data within the asynchronous coupling circuit has been emptied.

Hence, the data source can be prevented from providing any further data to the bridge circuit until the data within the asynchronous coupling circuit has been transmitted to the data receiver. Again, this ensures that no data is lost when switching from asynchronous data transfer to synchronous data transfer.

In one embodiment, the first interface circuit comprises a path operable to transmit a ready signal to the data source indicative of the asynchronous coupling circuit having capacity to receive further data.

Providing a ready signal to the device supplying data to the bridge circuit provides a convenient mechanism to signal to the data source whether or not the bridge circuit has suitable storage capacity to receive any further data without any existing data being lost or overwritten.

In one embodiment, the first interface circuit comprises an AMBA extensible interface and the ready signal is transmittable in association with one of its data channels.

Accordingly, in embodiments which utilise the AMBA extensible interface (AXI) the existing ready signalling path associated a data channel between the data source and the data receiver can be readily utilised to transmit the ready signal between the bridge circuit and the data source. It will be appreciated that by utilising an existing signalling path over which the ready signal is transmitted, no additional dedicated signalling paths need to be provided. Accordingly, this provides for highly flexible use of the bridge circuit and readily provides for interoperability.

In one embodiment, the synchronous coupling circuit comprises a bus.

Hence, synchronous transfer between the data source and the data receiver is achieved by using a suitably sized data bus which is typically operable to transfer data within the same clock cycle and accordingly has improved latency.

In one embodiment, the control logic is operable in response to the synchronous transfer request signal to pass the data synchronously between the first interface circuit and the second interface circuit via the bus.

In one embodiment, the control logic is responsive to the synchronous transfer request signal indicating that the first data rate and the second data rate are equal to cause data to be passed by the synchronous coupling circuit once any data within the asynchronous coupling circuit has been emptied.

Hence, when the first data rate and the second data rate are equal synchronous data transfer can be supported.

In one embodiment, the control logic is responsive to an asynchronous transfer request signal indicating that one of the first data rate and the second data rate will change to a value which is not an integer multiple of the other to cause data to be passed by the asynchronous coupling circuit before the change in the value occurs.

Hence, prior to the first data rate and second data rate changing to values which are not integer multiples, the asynchronous transfer request signal is provided. The control logic can then cause data to be transferred using the asynchronous coupling circuit at a suitable point in time prior to the change in value occurring to ensure that no data is lost or corrupted. In one embodiment, the control logic will signal that the bridge circuit can now support asynchronous data transfer to enable the change in value to take place.

In one embodiment, the asynchronous coupling circuit comprises a first-in first-out buffer operable to store the data from the data source at the first data rate and to read the data for transmission to the data receiver at the second data rate.

Using a first-in first-out (FIFO) buffer provides a convenient mechanism to facilitate asynchronous transmission between the data source and the data receiver. It will be appreciated that the size of the FIFO buffer will be selected to suit the particular application. The use of the FIFO buffer enables data to be temporarily stored by the bridging circuit prior to transmission to the data receiver at a convenient future point in time.

In one embodiment, the control logic is operable in response to the asynchronous transfer request signal to pass the data asynchronously between the first interface circuit and the second interface circuit via the first-in first-out buffer.

According to a second aspect of the present invention there is provided in a bridge circuit comprising a first interface circuit operable to receive data from a data source at a first data rate, a second interface circuit operable to transmit the data to a data receiver at a second data rate, and a data coupling circuit comprising a synchronous coupling circuit operable to pass the data synchronously between the first interface circuit and the second interface circuit and an asynchronous coupling circuit operable to pass the data asynchronously between the first interface circuit and the second interface circuit, a method of transferring data between the first interface circuit and the second interface circuit, the method comprising the steps of: (a) providing a synchronous transfer request signal indicating that either the first data rate is an integer multiple of the second data rate or the second data rate is an integer multiple of the first data rate; and (b) in response to receipt of the synchronous transfer request signal, causing data to be passed by the synchronous coupling circuit once any data within the asynchronous coupling circuit has been emptied.

BRIEF DESCRIPTION OF THE DRAWINGS

The present invention will be described further, by way of example only, with reference to preferred embodiments thereof as illustrated in the accompanying drawings, in which.

DESCRIPTION OF THE PREFERRED EMBODIMENTS

Figure 1A:
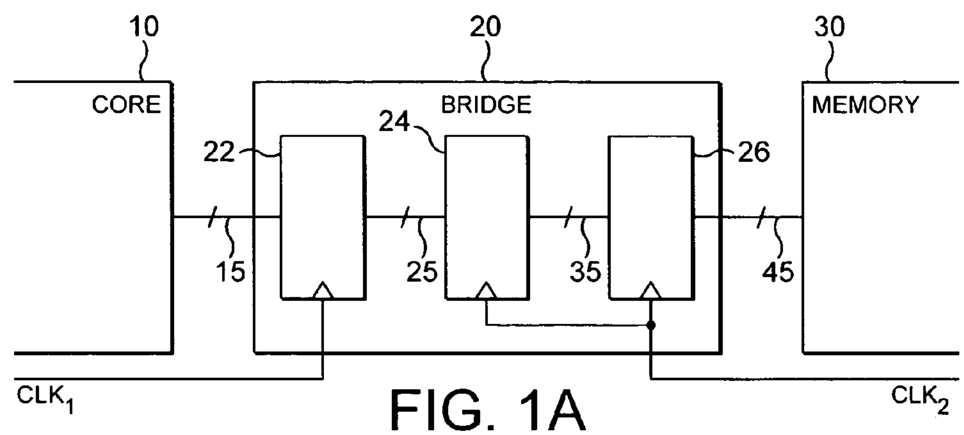
FIG. 1A schematically illustrates a known bridge circuit.
Figure 1B:
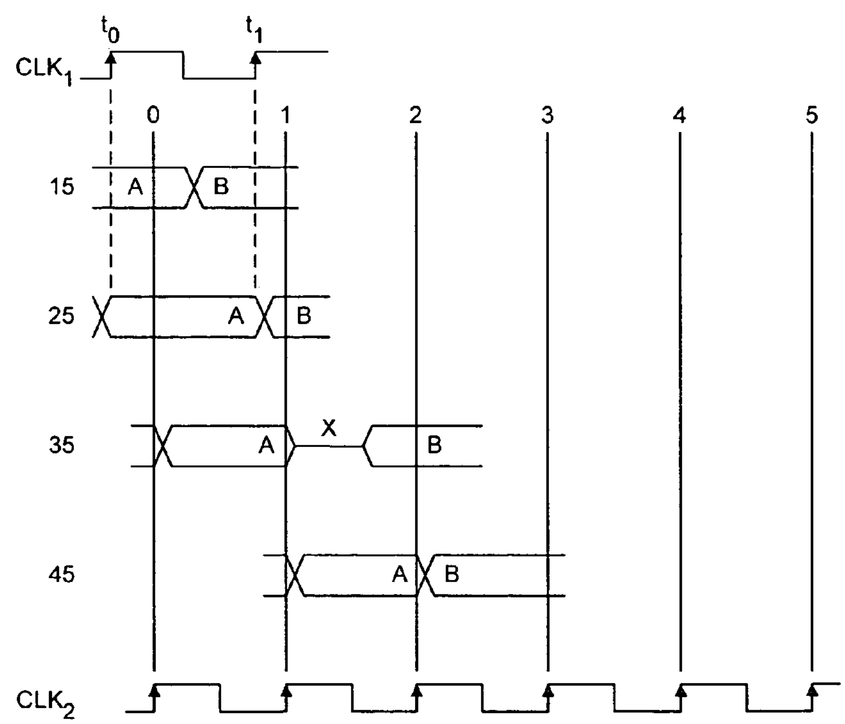
FIG. 1B is a timing diagram illustrating the operation of the bridge circuit illustrated in FIG. 1A.
Figure 2A:
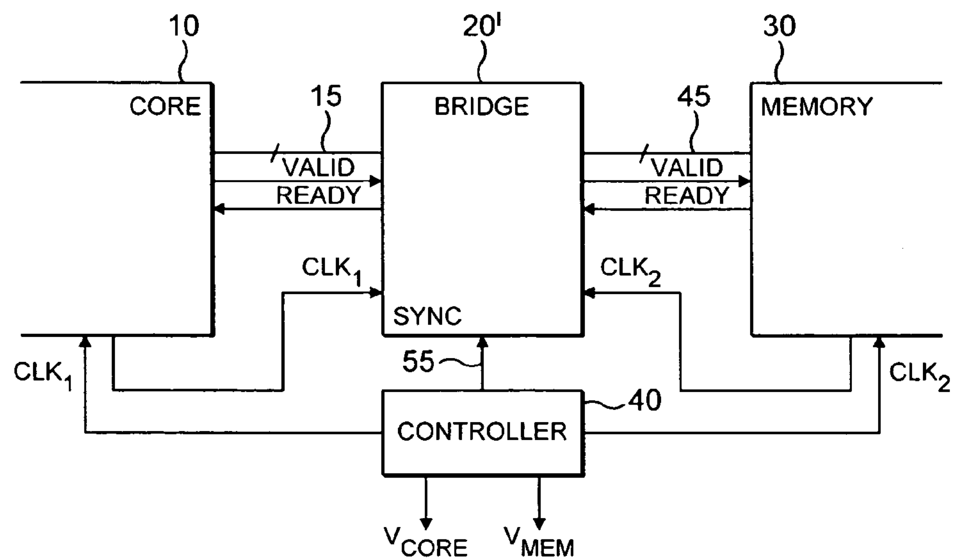
FIG. 2A illustrates schematically a bridge circuit according to an embodiment of the present invention for use in architectures employing an AMBA extensible interface (AXI) arrangement.

FIG. 2A illustrates an embodiment of the present invention which utilises an AMBA extensible interface.

The bridge circuit 20' receives data at a first data rate over the data bus 15 from the core 10. Data received by the bridge circuit 20' is provided at a second data rate over the data bus 45 to a memory 30. The bridge circuit 20' receives a clock signal $CLK_1$ from the core 10 which provides an indication of the data rate of the data supplied by or to the core 10. Similarly, the bridge circuit 20' receives a clock signal $CLK_2$ from the memory 30 indicative of the data rate of the data to be provided to or from the memory 30.

The clock signals $CLK_1$ and $CLK_2$ are provided by a controller 40 to the core 10 and the memory 30 respectively. The controller 40 controls the frequency of the clock signals $CLK_1$ and $CLK_2$ in dependence on the operating requirements placed on the core 10 and the memory 30 in order to maximise energy efficiency. Similarly, in dependence on those operating requirements the controller 40 will also vary the voltage $V_{core}$ and $V_{mem}$ provided to the core 10 and the memory 30 respectively in order to maximise energy efficiency.

The AMBA extensible interface provides a number of channels over which information and data can be provided. These channels comprise two address channels, a write data channel, a read data channel, and a response channel. The data buses 15 and 45 are examples of one channel within an AMBA extensible interface. The other channels have been omitted to improve clarity of the drawings.

Each channel, such as the write data channel, comprises at least two signal paths and a bus. The signal paths carry a ready signal (which indicates that a receiver is in a state in which it can receive data over the bus) and a valid signal (over which the data source can indicate to the receiver that data is ready to be transmitted). The bus is a data bus such as the data buses 15 and 45 (over which the data values are actually transmitted).

When the controller 40 arranges for the core 10 and the memory 30 to be operating at data rates which do not support synchronous data transfer, the controller 40 will provide an asynchronous transfer request signal over path 55 (typically expressed by the signal provided over path 55 being set at a logical '0') to the bridge circuit 20' requesting that the bridge circuit 20' operate in an asynchronous mode, where data is transferred asynchronously. It will be appreciated that synchronous data transfer can only occur when the first and second data rates are equal or where they are integer multiples of each other, in all other circumstances asynchronous data transfer will be required.

As will be explained in more detail below, when operating in the asynchronous mode, the bridge circuit 20' can provide a signal to the data source (either the core 10 or the memory 30) using the ready signalling path associated with the particular channel being utilised to transfer the data which indicates the data capacity of the bridge circuit 20'. The signal provided will indicate that either the bridge circuit 20' has the capacity to receive further data or will indicate that the bridge circuit has no capacity to receive further data (i.e. that the bridge circuit is full).

When operating in the asynchronous mode the core 10 will supply data to the bridge circuit 20' at the core 10 data rate. Should the bridge circuit 20' become full, then the bridge circuit 20' will provide the signal to the core 10 indicating that it has no capacity to receive further data. In response, the core 10 will stall and will prevent further data from being output on the data bus 15. Once the bridge circuit 20' has capacity to receive further data, the signal will be de-asserted and the core 10 will resume outputting data onto the bus 15.

A similar method of operation occurs when transferring data from the memory 30 via the bridge circuit 20' to the core 10 whereupon a signal will be asserted and provided to the memory 30 when the bridge circuit 20' indicates that it has no capacity to receive further data.

The bridge circuit 20' utilises the valid and ready signals to indicate the status of the bridge circuit 20' to the core 10 and the memory 30. Because the bridge circuit 20' can utilise the signalling paths provided within the AMBA extensible interface architecture the need for a dedicated control path to stall either the core 10 or the memory when the bridge circuit 20' is unable to receive any further data is obviated. It will be appreciated that this arrangement provides significant flexibility and interoperability in environments which utilise the AMBA extensible interface architecture.

When the operating requirements on the core 10 and the memory 30 are such that they are required to operate at the same data rate or the data rates are such that synchronous data transfer is possible, the controller 40 will assert a synchronous transfer request signal over the path 55 (typically expressed by the signal provided over path 55 being set at a logical '1') to indicate to the bridge circuit 20' that it should switch to operate in the synchronous mode, where data is transferred synchronously. As will be described in more detail below, the bridge circuit 20' will, in response to the synchronous transfer request signal, firstly drain the asynchronous coupling circuit of data stored therein in order to prevent the loss of any data before switching to the synchronous mode. Once the data in the asynchronous coupling circuit has been drained the switch will occur and data will be transferred thereafter between the core 10 and the memory 30 via the bridge circuit 20' in a synchronous manner.

Should it be anticipated that the data rates of the core 10 and the memory 30 will change such that they can no longer support synchronous data transfer then, the controller 40 will assert the asynchronous transfer request signal over the path 55 to indicate to the bridge circuit 20' that it should revert to operating in the asynchronous mode. Accordingly, the same asynchronous mode operation as that described above will then be reverted to.

Figure 2B:
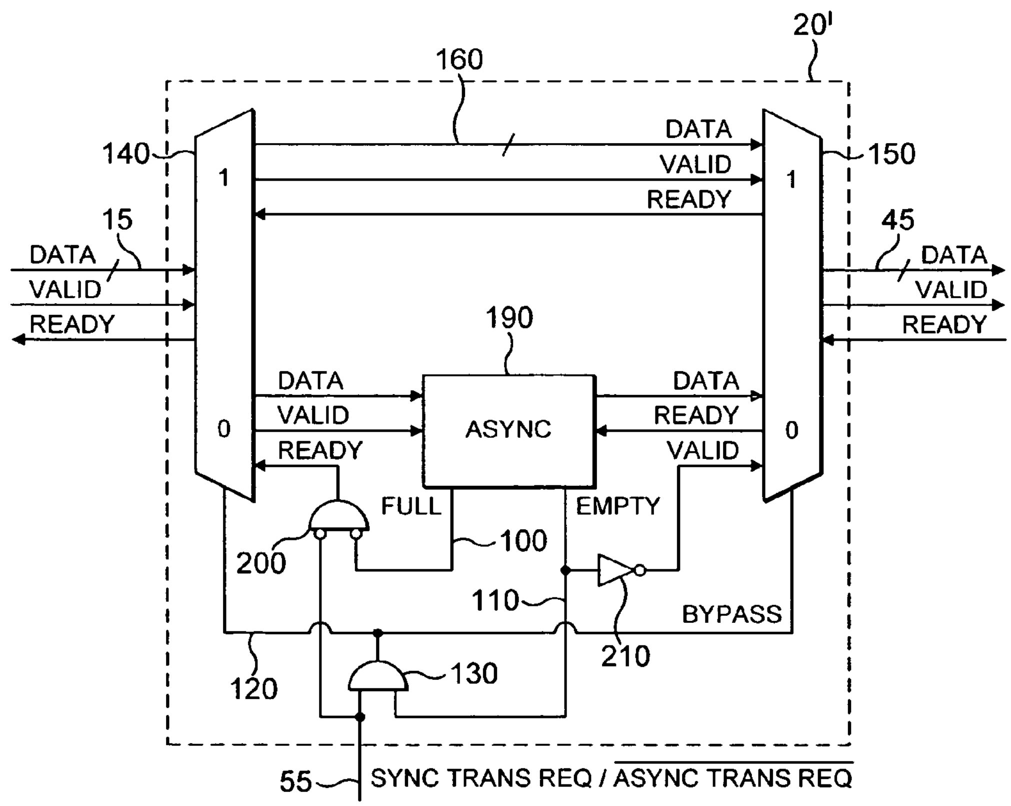
FIG. 2B illustrates schematically the arrangement of the bridge circuit of FIG. 2A in more detail.

FIG. 2B illustrates schematically the arrangement of the bridge circuit 20'. As mentioned above, the bridge circuit 20' supports both synchronous data transfer in the synchronous mode and asynchronous data transfer in the asynchronous mode.

The data bus 15 is coupled to a multiplexer 140. At one output of the multiplexer 140 a data bus 160 is provided which is coupled to a first input of another multiplexer 150. At the other output of the multiplexer 140 there is provided a bus 170 which is coupled to an asynchronous coupling circuit 190 which in turn is coupled to the other input of the other multiplexer 150 via a data bus 180. Hence, it will be appreciated that by switching the multiplexers 140 and 150 data can be routed from the data bus 15 to the data bus 45 via either the data bus 160 or via the asynchronous coupling circuit 190.

When operating in the asynchronous mode, data is provided over the data bus 15 to the multiplexer 140. The multiplexers 140 and 150 couple data bus 15 to data bus 45 via the asynchronous coupling circuit 190. In the asynchronous mode, the supply of data to the bridge circuit 20' is controlled using the ready signalling path.

If the asynchronous coupling circuit 190 becomes full, or if the bridge circuit 20' is requested to switch to synchronous mode and there is still data in the asynchronous coupling circuit 190 then a ready signal is de-asserted to indicate that the bridge circuit 20' is not able to receive any further data. This is achieved by coupling the signal provided over the path 55 and the full signal provided over the path 100 to respective inverting inputs of an AND gate 200. Hence, when the full signal provided over the path 100 indicates that the asynchronous coupling circuit 190 is not full (typically expressed by the full signal provided over path 100 being set at a logical '0') and signal provided over the path 55 is not asserted (indicating that synchronous data transfer has not been requested) then the AND gate 200 provides a signal which is propagated via the multiplexer 140 and over the ready signalling path to the core 10 to indicate that the bridge circuit 20' is in a condition to receive data. Should either the synchronous data transfer request signal be asserted over path 55 to indicate that synchronous transfer mode is required, or a full signal be provided over the path 100 to indicate that the asynchronous coupling circuit 190 is full, then the ready signal provided by the AND gate 200 is de-asserted which in turn is propagated over the ready signalling path to the core 10 to indicate that the bridge circuit 20' is not in a suitable state for receiving data. Accordingly, the core 10 will cease to transmit data to the bridge circuit 20' until the ready signal is re-asserted.

As mentioned above, once it is determined that the bridge circuit 20' should switch to the synchronous mode, the synchronous transfer request signal is asserted on the path 55. The assertion of the synchronous transfer request signal on the path 55 causes the ready signal to be de-asserted until all data stored in the asynchronous coupling circuit 190 has been emptied. Data will then be provided by the asynchronous coupling circuit 190 via the multiplexer 150 and the data bus 45 to the memory 30 until the asynchronous coupling circuit 190 is empty. Once the asynchronous coupling circuit 190 is emptied then the empty signal provided over the path 110 is asserted. This is in turn inverted by an inverter 210 which causes a valid signal to be asserted to indicate to the memory 30 that no further data is currently available from the bridge circuit 20'. The empty signal asserted on path 110 and the synchronous transfer request signal asserted on path 55, causes a bypass signal to be provided over path 120 to the multiplexers 140 and 150. This bypass signal causes the multiplexers 140 and 150 to select their other inputs, thereby coupling the data bus 15 to the data bus 45 via the data bus 160. Accordingly, synchronous data transfer can then occur.

When the controller 40 senses that the data rates of the core 10 and the memory 30 will change such that synchronous data transfer will no longer be possible, the asynchronous transfer request signal is asserted, which indicates that asynchronous transfer mode is required. The AND gate 130 de-asserts the bypass signal on the path 120 which causes the multiplexers 140 and 150 to switch the data bus 15 to the data bus 45 via the asynchronous coupling logic 190. Hence, the bridge circuit will then be able to support asynchronous data transfer when the clock rates change.

Accordingly, it can be seen that the bridge circuit 20' supports both synchronous and asynchronous transfer of data between the core 10 and the memory 30. When switching from the asynchronous mode to the synchronous mode the bridge circuit 20' causes switching of modes to be deferred until after any data in the asynchronous switching circuit has been emptied. By ensuring that all data has been emptied from the asynchronous coupling circuit 190 it can be ensured that no data is lost when switching between the asynchronous and synchronous modes.

Figure 3:
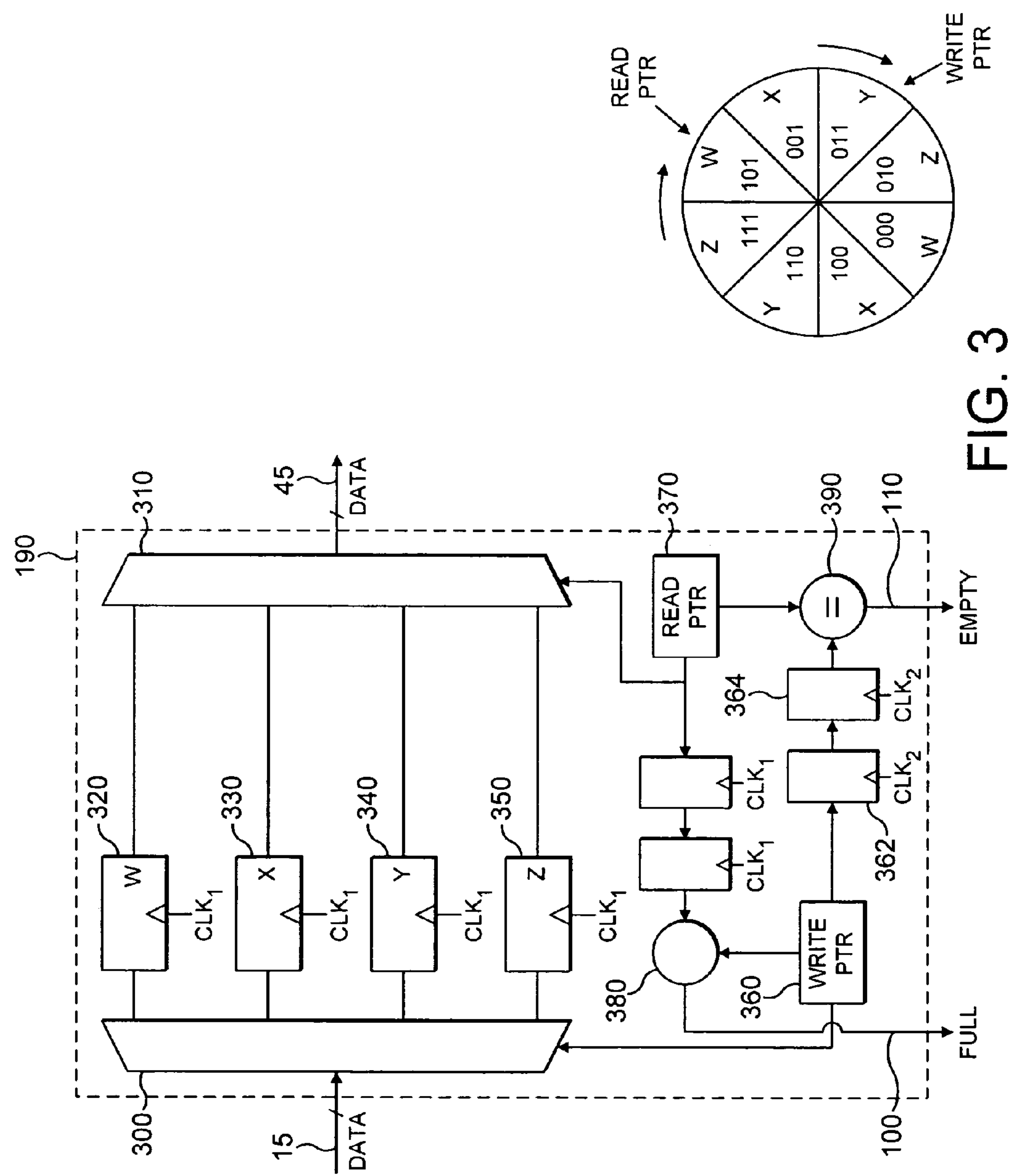
FIG. 3 illustrates schematically the arrangement of the asynchronous coupling logic of FIG. 2B.

FIG. 3 illustrates schematically an arrangement of the asynchronous coupling circuit 190. The circuit is arranged to provide a FIFO buffer which has a number of registers 320 to 350 for storing data. Data received over the bus 15 is stored in one of the registers 320 to 350.

The selection of which register to store data is controlled by the write pointer logic 360. The write pointer logic 360 is arranged to select a first register, such as the register 320, into which a first data value is to be stored and then to store subsequent data values in the register 330, the register 340 and then the register 350. Thereafter the write pointer logic 360 will loop back and point to register 320, and so on.

Similarly, the read pointer logic 370 controls the multiplexer 310 in order to select the appropriate register 320 to 350 from which data is to be read for transmission over the data bus 45. Again, the read pointer logic 370 may be arranged to select the register 320 initially and then to select the register 330, the register 340 and then the register 350. Thereafter the read pointer logic 370 will loop back to select the register 320 and so on.

The operation of the asynchronous coupling circuit 190 will now be described. Initially, the read pointer and write pointer are arranged to point to the same register such as, for example, register 320. However, it will be appreciated that the read pointer logic and write pointer logic could be arranged to point to any other register. Because the read pointer and write pointer both point to the same register, the comparator logic 390 will output a signal on the path 110 indicating that the asynchronous coupling circuit is empty (i.e. that it currently stores no data).

On receipt of a data value over the data bus 15, that data value will be stored in the register pointed to by the write pointer (i.e. register 320) and, once stored, the value of the write pointer will be incremented. The value of the write pointer will be clocked through the registers 362 and 364 to the comparator logic 390. Given that the value of the read pointer and the write pointer is now not equal the comparator logic 390 will de-assert the empty signal on the path 110 which in turn will cause a valid signal to be propagated to the memory 30 to indicate to the memory 30 that there is a data value stored in the register 320 available to be read. After reading the data value from the register 320 the value of the read pointer is incremented.

If the value of the read pointer and the write pointer are then equal then the comparison logic 390 will re-assert the empty signal to cause the valid signal to be de-asserted which in turn indicates to the memory 30 that no further data values are available.

This process continues with data being read into the register 320, 330, 340 and 350 and read from those registers under the control of the write pointer logic 360 and the read pointer logic 370.

In the event that each of the registers 320 to 350 contain a data value then the logic 380 will assert a full signal over the path 100. As mentioned above, the full signal will cause the ready signal to the core 10 to be de-asserted to indicate to the core 10 that no further data can be received.

The read and write pointers are implemented using Gray codes in order to reduce the probability of a transition error occurring.

From the above discussion of the embodiments, it will be appreciated that a bridge circuit is provided which can operate in both a synchronous and an asynchronous mode. Supporting both modes enables the bridge circuit to operate with optimal efficiency under varying data rates of devices between which the bridge circuit is coupled. When the data rate of data received differs from the data rate of data to be transmitted, the bridge is operated in an asynchronous mode to enable the data to be passed in an asynchronous manner between the two devices. When the two data rates are equal, the bridge circuit operates in a synchronous mode. Causing the bridge circuit to operate in a synchronous mode reduces any latency introduced by the bridge circuit. It will be appreciated that reducing any latency caused by the bridge circuit significantly improves the efficiency of data transfers between the data source and the data receiver. Also, by preventing data from being passed through the synchronous coupling circuit until all the data in the asynchronous coupling circuit has been transmitted ensures that no data is lost when a dynamic switch to synchronous transfer is requested.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A bridge circuit comprising:

a first interface circuit operable to receive data from a data source at a first data rate;

a second interface circuit operable to transmit said data to a data receiver at a second data rate;

a data coupling circuit comprising:

a synchronous coupling circuit operable to pass said data synchronously between said first interface circuit and said second interface circuit; and an asynchronous coupling circuit operable to pass said data asynchronously between said first interface circuit and said second interface circuit, said bridge circuit further comprising control logic responsive to a synchronous transfer request signal indicating that either said first data rate is an integer multiple of said second data rate or said second data rate is an integer multiple of said first data rate to cause data to be passed by said synchronous coupling circuit once any data within said asynchronous coupling circuit has been emptied.

2. The bridge circuit of claim 1, wherein said control logic is further operable in response to said synchronous transfer request signal to prevent said data source from supplying data to said first interface circuit until data within said asynchronous coupling circuit has been emptied.

3. The bridge circuit of claim 1, wherein said first interface circuit comprises a path operable to transmit a ready signal to said data source indicative of said asynchronous coupling circuit having capacity to receive further data.

4. The bridge circuit of claim 3, wherein said first interface circuit comprises an advanced microcontroller bus architecture (AMBA) extensible interface and said ready signal is transmittable in association with one of its data channels.

5. The bridge circuit of claim 1, wherein said synchronous coupling circuit comprises a bus.

6. The bridge circuit of claim 5, wherein said control logic is operable in response to said synchronous transfer request signal to pass said data synchronously between said first interface circuit and said second interface circuit via said bus.

7. The bridge circuit of claim 1, wherein said control logic is responsive to said synchronous transfer request signal indicating that said first data rate and said second data rate are equal to cause data to be passed by said synchronous coupling circuit once any data within said asynchronous coupling circuit has been emptied.

8. The bridge circuit of claim 1, wherein said control logic is responsive to an asynchronous transfer request signal indicating that one of said first data rate and said second data rate will change to a value which is not an integer multiple of the other to cause data to be passed by said asynchronous coupling circuit before said change in said value occurs.

9. The bridge circuit of claim 8, wherein said asynchronous coupling circuit comprises a first-in first-out buffer operable to store said data from said data source at said first data rate and to read said data for transmission to said data receiver at said second data rate.

10. The bridge circuit of claim 9, wherein said control logic is operable in response to said asynchronous transfer request signal to pass said data asynchronously between said first interface circuit and said second interface circuit via said first-in first-out buffer.

11. In a bridge circuit comprising a first interface circuit operable to receive data from a data source at a first data rate, a second interface circuit operable to transmit said data to a data receiver at a second data rate, and a data coupling circuit comprising a synchronous coupling circuit operable to pass said data synchronously between said first interface circuit and said second interface circuit and an asynchronous coupling circuit operable to pass said data asynchronously between said first interface circuit and said second interface circuit, a method of transferring data between said first interface circuit and said second interface circuit, said method comprising the steps of:

(a) providing a synchronous transfer request signal indicating that either said first data rate is an integer multiple of said second data rate or said second data rate is an integer multiple of said first data rate; and (b) in response to receipt of said synchronous transfer request signal, causing data to be passed by said synchronous coupling circuit once any data within said asynchronous coupling circuit has been emptied.

12. The method of claim 11, further comprising the step of:

in response to said synchronous transfer request signal, preventing said data source from supplying data to said first interface circuit until data within said asynchronous coupling circuit has been emptied.

13. The method of claim 11, further comprising the step of:

providing a path operable to transmit a ready signal to said data source indicative of said asynchronous coupling circuit having capacity to receive further data.

14. The method of claim 13, wherein said first interface circuit comprises an advanced microcontroller bus architecture (AMBA) extensible interface and said ready signal is transmittable in association with one of its data channels.

15. The method of claim 11, wherein said synchronous coupling circuit comprises a bus.

16. The method of claim 15, wherein said step (b) further comprises the step of:

in response to said synchronous transfer request signal, passing said data synchronously between said first interface circuit and said second interface circuit via said bus.

17. The method of claim 11, wherein said step (a) comprises the step of providing said synchronous transfer request signal indicating that said first data rate and said second data rate are equal.

18. The method of claim 11, further comprising the steps of:

providing an asynchronous transfer request signal indicating that one of said first data rate and said second data rate will change to a value which is not an integer multiple of the other; and causing data to be passed by said asynchronous coupling circuit before said change in said value occurs.

19. The method of claim 18, wherein said asynchronous coupling circuit comprises a first-in first-out buffer operable to store said data from said data source at said first data rate and to read said data for transmission to said data receiver at said second data rate.

20. The method of claim 19, further comprising the step of:

in response to said asynchronous transfer request signal, passing said data asynchronously between said first interface circuit and said second interface circuit via said first-in first-out buffer.

* * * * *